US012603625B2

(12) United States Patent
Chee

(10) Patent No.: US 12,603,625 B2
(45) Date of Patent: Apr. 14, 2026

(54) STACKED DIGITAL CURRENT STEERING AUTOMATIC GAIN CONTROL ATTENUATOR

(71) Applicant: MOTOROLA SOLUTIONS, INC., Chicago, IL (US)

(72) Inventor: Chong Hin Chee, Gelugor (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 610 days.

(21) Appl. No.: 18/147,596

(22) Filed: Dec. 28, 2022

(65) Prior Publication Data

US 2024/0223147 A1     Jul. 4, 2024

(51) Int. Cl.
| | |
|---|---|
| *H03F 3/45* | (2006.01) |
| *H03F 3/195* | (2006.01) |
| *H03G 1/00* | (2006.01) |
| *H03G 3/30* | (2006.01) |

(52) U.S. Cl.
CPC ........... *H03G 3/3026* (2013.01); *H03F 3/195* (2013.01); *H03G 1/0088* (2013.01); *H03G 3/3063* (2013.01); *H03F 2200/294* (2013.01)

(58) Field of Classification Search
CPC ........................................................ H03F 3/45
USPC ........................................................ 330/253
See application file for complete search history.

(56) References Cited

U.S. PATENT DOCUMENTS

| | | | | |
|---|---|---|---|---|
| 5,986,502 A | * | 11/1999 | Nakamura | ............ H03F 3/4565 |
| | | | | 330/311 |
| 7,113,040 B2 | * | 9/2006 | Nguyen | .................... H03F 1/34 |
| | | | | 330/253 |
| 8,860,508 B1 | * | 10/2014 | Davis | ................... H03G 1/0023 |
| | | | | 330/311 |
| 9,331,651 B1 | | 5/2016 | Ng et al. | |

OTHER PUBLICATIONS

Van Der Plas, et al., "A 14-bit Intrinsic Accuracy Q2 RAndom Walk CMOS DAC," IEEE Journal of Solid-State Circuits, vol. 34, No. 12, Dec. 1999 (pp. 1708-1718).

* cited by examiner

*Primary Examiner* — Henry Choe
(74) *Attorney, Agent, or Firm* — Michael Best & Friedrich LLP

(57) ABSTRACT

An automatic gain control (AGC) attenuator for an amplifier. In one example, the AGC attenuator includes a first transistor stack including a plurality of first banks of current steering differential transistor pairs and configured to receive a radio frequency (RF) input signal and output a first attenuated RF signal. Each first bank of the plurality of first banks is configured to attenuate the RF input signal by a predetermined value. The AGC attenuator also includes a second transistor stack that includes a plurality of second banks of current steering differential transistor pairs. The second transistor stack is cascoded to the first transistor stack, and is configured to receive the first attenuated RF signal and output a second attenuated RF signal. Each second bank of the plurality of second banks is configured to attenuate the first attenuated RF signal by a predetermined value.

20 Claims, 6 Drawing Sheets

404 — Receive RF Input At First Stack

408 — Attenuate RF Input At First Stack

412 — Output First Attenuated RF Signal

416 — Receive First Attenuated RF Signal

420 — Attenuate First Attenuated RF Signal

424 — Output Second Attenuated RF Signal

500

504 — Steer Current Off RF Signal

508 — Output Current Steered Off RF Signal

512 — Replicate Current Steered Off RF Signal

516 — Inject Replicated Current to Second Stack

STACKED DIGITAL CURRENT STEERING AUTOMATIC GAIN CONTROL ATTENUATOR

BACKGROUND

Applications for radio frequency integrated circuits (RFICs) include radar, communications, or other wireless transmission systems and devices. Intermodulation distortion (IMD) is caused by non-linear behavior of signal processing devices. The third-order intercept point (IP3) is a figure of merit which can be used to indicate how large of a signal an amplifier can process before IMD occurs.

RFICs may include a low-noise amplifier (LNA) to increase the amplitude of a low power radio frequency (RF) signal. However, LNAs amplify both the RF signal and the noise associated with the signal. RFICs may also include an automatic gain control (AGC) to reduce, or attenuate, an RF signal when it is too strong.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments, examples, aspects, and features that include the claimed subject matter, and explain various principles and advantages.

Figure 1:
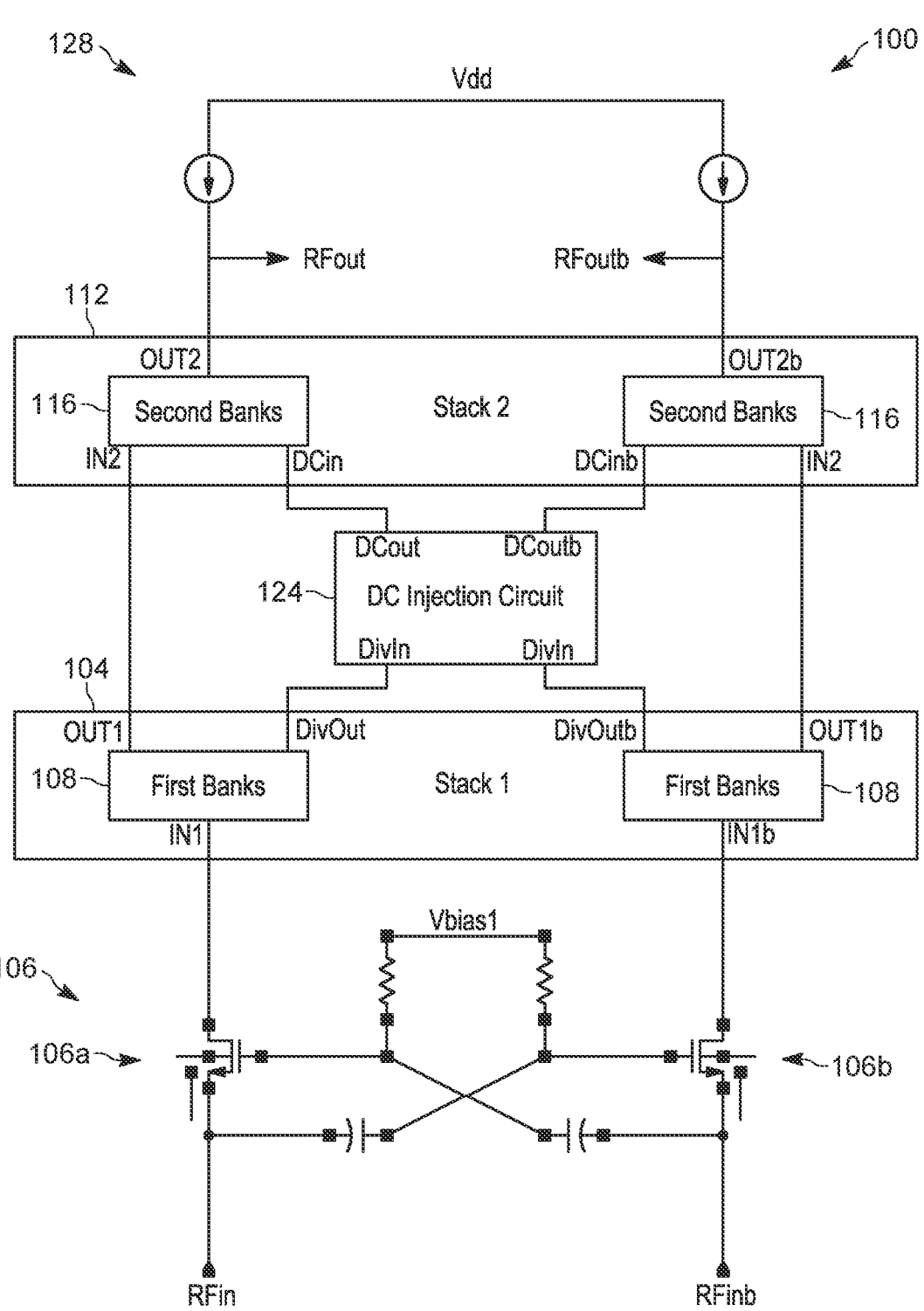
FIG. 1 illustrates an automatic gain control attenuator, according to some aspects.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments, examples, aspects, and features.

The apparatus and method components have been represented where appropriate by conventional symbols in the drawings, showing only those specific details that are pertinent to understanding the embodiments, examples, aspects, and features described and illustrated so as not to obscure the disclosure with details that will be readily apparent to those of ordinary skill in the art having the benefit of the description herein.

DETAILED DESCRIPTION

Strong RF signals may negatively impact IP3 for a system. AGC attenuators are typically designed to attenuate the RF signal in small steps. If the AGC attenuator is purely digital, and a large total attenuation range is desired, the AGC attenuator may be very large in size and therefore very expensive. Large AGC attenuators also tend to include large parasitic capacitances, which can reduce the signal-to-noise ratio and linearity.

Traditional automatic gain control (AGC) attenuators in radio frequency integrated circuits (RFICs) may rely on analog current steering differential transistor pairs to gradually shift current of an RF signal in order to attenuate the RF signal. AGCs using analog current steering differential transistor pairs to attenuate RF signals require large current overheads and more space to include linearizing circuitry and a digital-to-analog (DAC) converter. Additionally, the bias current steered away from the analog current steering differential transistor pairs reduces the linear capabilities of the transistors included in the differential transistor pairs. The increased size of the AGC and the reduced bias current cause a reduction in the third-order intercept point (IP3) for the RFIC. Additionally, voltage headroom requirements reduces the 1 dB compression point (P1 dB) for the RFIC due to signal compression on the transistors included in the differential transistor pairs.

To address, among other things, these problems, systems and methods are provided herein for a stacked digital current steering automatic gain control attenuator. Among other things, examples described herein provide an automatic gain control (AGC) attenuator for an amplifier. The AGC attenuator includes a first transistor stack including a plurality of first banks of current steering differential transistor pairs and configured to receive a radio frequency (RF) input signal and output a first attenuated RF signal. Each first bank of the plurality of first banks is configured to attenuate the RF input signal by a predetermined value. The AGC attenuator also includes a second transistor stack that includes a plurality of second banks of current steering differential transistor pairs, that is cascoded to the first transistor stack, and that is configured to receive the first attenuated RF signal and to output a second attenuated RF signal. Each second bank of the plurality of second banks is configured to attenuate the first attenuated RF signal by a predetermined value.

In some aspects, each differential transistor pair in the first transistor stack includes a main transistor and a complementary transistor. The main transistor is configured to receive a first source signal and a first gate signal. The complementary transistor is configured to receive the first source signal and a second gate signal, the second gate signal being complementary to the first gate signal.

In some aspects, each differential transistor pair in the first transistor stack includes a main transistor, a complementary transistor, a first switch, and a second switch. The main transistor includes a first drain terminal, a first source terminal, and a first gate terminal. The complementary transistor includes a second drain terminal, a second source terminal, and a second gate terminal. The first switch is electrically connected in series with at least one selected from the group consisting of the first drain terminal, the first source terminal, and the first gate terminal. The second switch is electrically connected in series with at least one selected from the group consisting of the second drain terminal, the second source terminal, and the second gate terminal.

In some aspects, the AGC attenuator includes a DC injection circuit configured to provide a DC injection current to the second transistor stack. The DC injection current is approximately equal to an amount of current steered away from the RF input signal.

In some aspects, the DC injection circuit includes a current mirror circuit and is configured to sense a current steered away from the RF input signal, generate a mirror of the current steered away from the RF input signal, and output the mirror as the DC injection current.

In some aspects, the DC injection circuit is configured to estimate an amount of current steered away from the RF input signal, and output the estimated current as the DC injection current.

In some aspects, the DC injection circuit includes a replica of the first transistor stack and is configured to sense a current steered away from an RF input signal in the replica of the first transistor stack, and output the current steered away from the RF input signal in the replica of the first transistor stack as the DC injection current.

In some aspects, the DC injection circuit is configured to receive a current steered away from the RF input signal, filter RF content from the current steered away from the RF input signal, and output the filtered current as the DC injection current.

In some aspects, the first transistor stack is arranged in a push-pull configuration and includes a plurality of n-channel field effect transistors (NFETs) and a plurality of p-channel field effect transistors (PFETs).

In some aspects, the number of transistors in each first bank of the plurality of first banks is determined by a logarithmic function, and the number of transistors in each second bank of the plurality of second banks is determined by a logarithmic function.

In some aspects, the number of transistors in each first bank of the plurality of first banks is determined by a linear function, the number of transistors in each second bank of the plurality of second banks is determined by a linear function, and the AGC attenuator further comprises a control circuit configured to control switching of each first bank of the plurality of first banks logarithmically, and control switching of each second bank of the plurality of second banks logarithmically.

Another example provides, a method of attenuating an RF signal for an amplifier. The method includes receiving, with a first transistor stack including a plurality of first banks of current steering differential transistor pairs, a radio frequency (RF) input signal. The method includes attenuating, with each first bank of the plurality of first banks, the RF input signal by a predetermined value. The method includes outputting, with the first transistor stack, a first attenuated RF signal. The method includes receiving, with a second transistor stack that includes a plurality of second banks of current steering differential transistor pairs and is cascoded to the first transistor stack, the first attenuated RF signal. The method includes attenuating, with each second bank of the plurality of second banks, the first attenuated RF signal by a predetermined value. The method includes outputting, with the second transistor stack, a second attenuated RF signal.

In some aspects, the method includes providing, with a DC injection circuit, a DC injection current to the second transistor stack, wherein the DC injection current is approximately equal to an amount of current steered away from the RF input signal.

In some aspects, the DC injection circuit includes a current mirror circuit, and the method further includes sensing, with the DC injection circuit, a current steered away from the RF input signal, generating, with the current mirror circuit, a mirror of the current steered away from the RF input signal, and outputting, with the DC injection circuit, the mirror as the DC injection current.

In some aspects, the method includes estimating, with the DC injection circuit, an amount of current steered away from the RF input signal, and outputting, with the DC injection circuit, the estimated current as the DC injection current.

In some aspects, the DC injection circuit includes a replica of the first transistor stack, and the method includes sensing, with the DC injection circuit, a current steered away from an RF input signal of the replica of the first transistor stack, and outputting, with the DC injection circuit, the current steered away from the RF input signal of the replica of the first transistor stack as the DC injection current.

In some aspects, the method includes receiving, with the DC injection circuit, a current steered away from the RF input signal, filtering, with the DC injection circuit, RF content from the current steered away from the RF input signal, and outputting; with the DC injection circuit, the filtered current as the DC injection current.

In some aspects, the first transistor stack is arranged in a push-pull configuration and includes a plurality of n-channel field effect transistors (NFETs) and a plurality of p-channel field effect transistors (PFETs).

In some aspects, the number of transistors in each first bank of the plurality of first banks is determined by a logarithmic function, and the number of transistors in each second bank of the plurality of second banks is determined by a logarithmic function.

In some aspects, the number of transistors in each first bank of the plurality of first banks is determined by a linear function, the number of transistors in each second bank of the plurality of second banks is determined by a linear function, and the method includes controlling, with a control circuit, switching of each first bank of the plurality of first banks logarithmically, and controlling, with a control circuit, switching of each second bank of the plurality of second banks logarithmically.

For ease of description, some or all of the example systems presented herein are illustrated with a single exemplar of each of its component parts. Some examples may not describe or illustrate all components of the systems. Other examples may include more or fewer of each of the illustrated components, may combine some components, or may include additional or alternative components.

It should be understood that although certain figures presented herein illustrate hardware and software located within particular devices, these depictions are for illustrative purposes only. In some examples, the illustrated components may be combined or divided into separate software, firmware, and/or hardware. For example, instead of being located within and performed by a single electronic processor, logic and processing may be distributed among multiple electronic processors. Regardless of how they are combined or divided as shown and unless the context clearly indicates otherwise, hardware and software components may be located on the same computing device or may be distributed among different computing devices connected by one or more networks or other suitable communication links.

FIG. 1 illustrates an example AGC attenuator 100, according to some aspects. In order to reduce the size of the AGC attenuator 100, and therefore reduce parasitic capacitance, the AGC attenuator 100 is implemented in a low-noise amplifier (LNA) rather than external to the LNA.

The AGC attenuator 100 includes a first transistor stack 104 stacked above RF input transistors 106a and 106b (collectively referred to herein as RF input transistors 106). It should be understood that the term stacked refers to a cascoded arrangement. Such arrangements are further described below with respect to various components. The first transistor stack 104 includes input node IN1 for receiving a radio frequency (RF) input signal RFin via RF input transistor 106a, and input node IN2 for receiving a complementary RF input signal RFinb via RF input transistor 106b. Although the RF input transistors 106 are illustrated in FIG. 1 as having a capacitor cross-coupled configuration, the RF input transistors 106 may alternatively be implemented without cross-coupled capacitors, such that RF signals are only received through respective source terminals of the RF input transistors 106. The first transistor stack 104 also includes first output nodes OUT1 and OUT1b for respectively outputting a first attenuated RF signal and a first attenuated complementary RF signal. The first transistor stack 104 includes second output nodes DivOut and DivOutb for respectively outputting the current diverted from the RF input signal and the current diverted from the complementary RF input signal.

The first transistor stack 104 includes a plurality of first banks 108. Each of the plurality of first banks 108 includes a predetermined number of current steering differential transistor pairs. In some instances, the transistors included in the current steering differential transistor pairs are complementary metal-oxide semiconductor (CMOS) transistors. Each differential transistor pair in the plurality of first banks 108 includes a main transistor and a complementary transistor.

In some instances, the main transistor in each differential transistor pair in the plurality of first banks 108 is configured to receive a first source signal and a first gate signal. For example, the main transistor may receive a source signal RFin and a gate signal of 1V. The complementary transistor in each differential transistor pair in the plurality of first banks 108 is configured to receive the first source signal and a second gate signal complementary to the first gate signal. For example, the complementary transistor may receive a source signal RFin and a gate signal between approximately 0 volts (V) and approximately 0.2V. The differential transistor pairs are fully switched such that when the main transistor turns on (e.g., in response to receiving a high signal at the gate of the main transistor), the complementary transistor turns off (e.g., in response to receiving a low signal at the gate of the complementary transistor). Similarly, when the complementary transistor turns on (e.g., in response to receiving the high signal), the main transistor turns off (e.g., in response to receiving the low signal).

The main transistor of each differential transistor pair is configured to output, at the drain terminal of the main transistor, an attenuated RF signal, and the complementary transistor of each differential transistor pair is configured to output the current steered away from the attenuated RF signal. The current steered away from the attenuated RF signal may be referred to herein as the diverted current.

Each of the plurality of first banks 108 is configured to attenuate the RF signal by a predetermined value. For example, each of the plurality of first banks 108 may be configured to attenuate the RF signal by 0.1 decibels (dB), 0.5 dB, 1 dB, or another suitable value. In order to attenuate the RF signal logarithmically (e.g., attenuating the RF signal by a predetermined decibel value), the number of differential transistor pairs included in each bank of the plurality of first banks 108 is determined based on a logarithmic function. For example, when the plurality of first banks 108 includes 128 banks, then the number of differential transistor pairs included in each bank of the plurality of first banks 108 decreases according to a logarithmic function across the 128 banks. However, in some instances, the number of differential transistor pairs included in each of the plurality of first banks 108 is determined based on a linear function. In such instances, the AGC attenuator 100 further includes a control circuit configured to control switching of each of the plurality of first banks 108 logarithmically such that each bank attenuates the RF signal by a predetermined value (e.g., a predetermined decibel value).

In order to implement, for example, an 8 bit attenuator that attenuates an RF signal at a log-linear scale, 256 banks of differential transistor pairs are required. Logarithmically sizing each of the plurality of first banks 108 across 256 banks could lead to a substantial increase in parasitic capacitance due to the large number of differential transistor pairs required. Therefore, the AGC attenuator 100 also includes a second transistor stack 112 cascoded to, or vertical to, the first transistor stack 104. The second transistor stack 112 includes first input nodes IN2 and IN2b for respectively receiving the first attenuated RF signal and the first attenuated complementary RF signal from the first transistor stack 104. The second transistor stack 112 also includes second input nodes DCin and DCinb for receiving direct current, as will be described in greater detail below. The second transistor stack 112 also includes second output nodes OUT2 and OUT2b for respectively outputting a second attenuated RF signal and a second attenuated complementary RF signal to the AGC attenuator output RFout and RFoutb of the AGC attenuator 100.

The second transistor stack 112 also includes a plurality of second banks 116, each including a predetermined number of current steering differential transistor pairs. In some instances, the transistors included in the current steering differential transistor pairs are complementary metal-oxide semiconductor (CMOS) transistors. Each differential transistor pair in the plurality of second banks 116 includes a main transistor and a complementary transistor. The main transistor in each differential transistor pair in the plurality of second banks 116 is configured to receive a first source signal and a gate signal. The complementary transistor in each differential transistor pair in the plurality of second banks 116 is configured to receive the first source signal and a second gate signal complementary to the first gate signal. The differential transistor pairs in the plurality of second banks 116 are fully switched such that when the main transistor turns on (e.g., in response to receiving a high signal at the gate of the main transistor), the complementary transistor turns off (e.g., in response to receiving a low signal at the gate of the complementary transistor). Similarly, when the complementary transistor turns on (e.g., in response to receiving the high signal), the main transistor turns off (e.g., in response to receiving the low signal).

The main transistor of each differential transistor pair in the plurality of second banks 116 is configured to output, at the drain terminal of the main transistor, an attenuated RF signal (e.g., a second attenuated RF signal and a second attenuated complementary RF signal), and the complementary transistor of each differential transistor pair is configured to output the current steered away from the attenuated RF signal. The differential transistor pairs in the plurality of second banks 116 are fully switched such that when the main transistor turns on (e.g., in response to receiving a high signal at the gate of the main transistor), the complementary transistor turns off (e.g., in response to receiving a complement of the high signal at the gate of the complementary transistor).

Each bank of the plurality of second banks 116 is configured to attenuate an RF signal (e.g., the first attenuated RF signal received from the first transistor stack 104) by a predetermined value by steering current away from the RF signal. For example, each of the plurality of first banks 108 may be configured to attenuate the RF signal by 0.1 decibels (dB), 0.5 dB, 1 dB, or another suitable value. Similar to the plurality of first banks 108, the number of differential transistor pairs included in each of the plurality of second banks 116 may be determined based on a logarithmic function. However, as described above with respect to the plurality of first banks 108, in some instances, the number of differential transistor pairs included in each of the plurality of second banks 116 is determined based on a linear function, and a control circuit controls switching of each of the plurality of second banks 116 logarithmically.

By implementing a first transistor stack and a second transistor stack in a cascode arrangement to attenuate the RF signal, the total number of transistor banks (e.g., 256 banks) in the attenuator is split between the two stacks, and the number of differential transistor pairs required for each bank is reduced relative to an attenuator implementing only a single stack. Therefore, parasitic capacitance in the attenuator is reduced.

Because current is steered away from the RF signal at every bank, or step, by the differential transistor pairs, the second transistor stack 112 may receive insufficient direct current from the first transistor stack 104 to bias the transistors in the plurality of second banks 116. As a result, there is a risk that the transistors in the plurality of second banks 116 will not operate in the linear region. Therefore, the AGC attenuator 100 further includes a DC injection circuit 124 electrically connected to the second transistor stack 112. The DC injection circuit 124 is configured to provide a DC injection current to the second transistor stack 112 in order to sufficiently bias the transistors of the second transistor stack 112. The DC injection current is approximately equal to the amount of current steered away, or diverted, from the first transistor stack 104. For example, when one milliamp is steered away from the first transistor stack 104, the DC injection circuit 124 injects approximately one milliamp into the second transistor stack 112.

In some instances, the DC injection circuit 124 is configured to receive (at node DivIn), from the first transistor stack 104, a diverted current that is steered away from the RF input signal via the drain terminal of the complementary transistor in each differential transistor pair configured to attenuate the RF input signal. The DC injection circuit 124 is also configured to receive (at node DivInb), from the first transistor stack 104, a complementary diverted current that is steered away from the complementary RF input signal via the drain terminal of the complementary transistor in each differential transistor pair configured to attenuate the complementary RF input signal.

In some instances, the DC injection circuit 124 includes a first current mirror circuit configured to sense the diverted current, generate a mirror of the diverted current, and output (at node DCout) a mirror of the diverted current as a DC injection current to the second transistor stack 112. The DC injection circuit 124 also includes a second current mirror circuit configured to sense the complementary diverted current, generate a mirror of the complementary diverted current, and output (at node DCoutb) a mirror of the complementary diverted current as a complementary DC injection current to the second transistor stack 112.

In some instances, the DC injection circuit 124 is configured to estimate (e.g., based on known parameters of the AGC attenuator 100), a value of the diverted current and the complementary diverted current, and output the estimated diverted current and the estimated complementary diverted current as the DC injection current and the complementary DC injection current, respectively, to the second transistor stack 112.

In some instances, the DC injection circuit 124 includes a replica of the first transistor stack 104, and is configured to sense the diverted current from the replica of the first transistor stack 104 as the DC injection current, and sense the complementary diverted current from the replica of the first transistor stack 104. The DC injection circuit 124 then outputs the diverted current as the DC injection current and the complementary diverted current as the complementary DC injection current.

In some instances, the DC injection circuit 124 is configured to receive the diverted current from the first transistor stack 104, filter the RF content from the diverted current, and output the filtered diverted current as the DC injection current. Similarly, the DC injection circuit 124 receives the complementary diverted current from the first transistor stack 104, filters the RF content from the complementary diverted current, and outputs the filtered complementary diverted current as the DC injection current.

The AGC attenuator 100 also includes current source 128 for biasing the output of the AGC attenuator 100 at a predetermined common-mode voltage. A common mode feedback loop controls the current source 128 to maintain the predetermined common-mode voltage.

Figure 2:
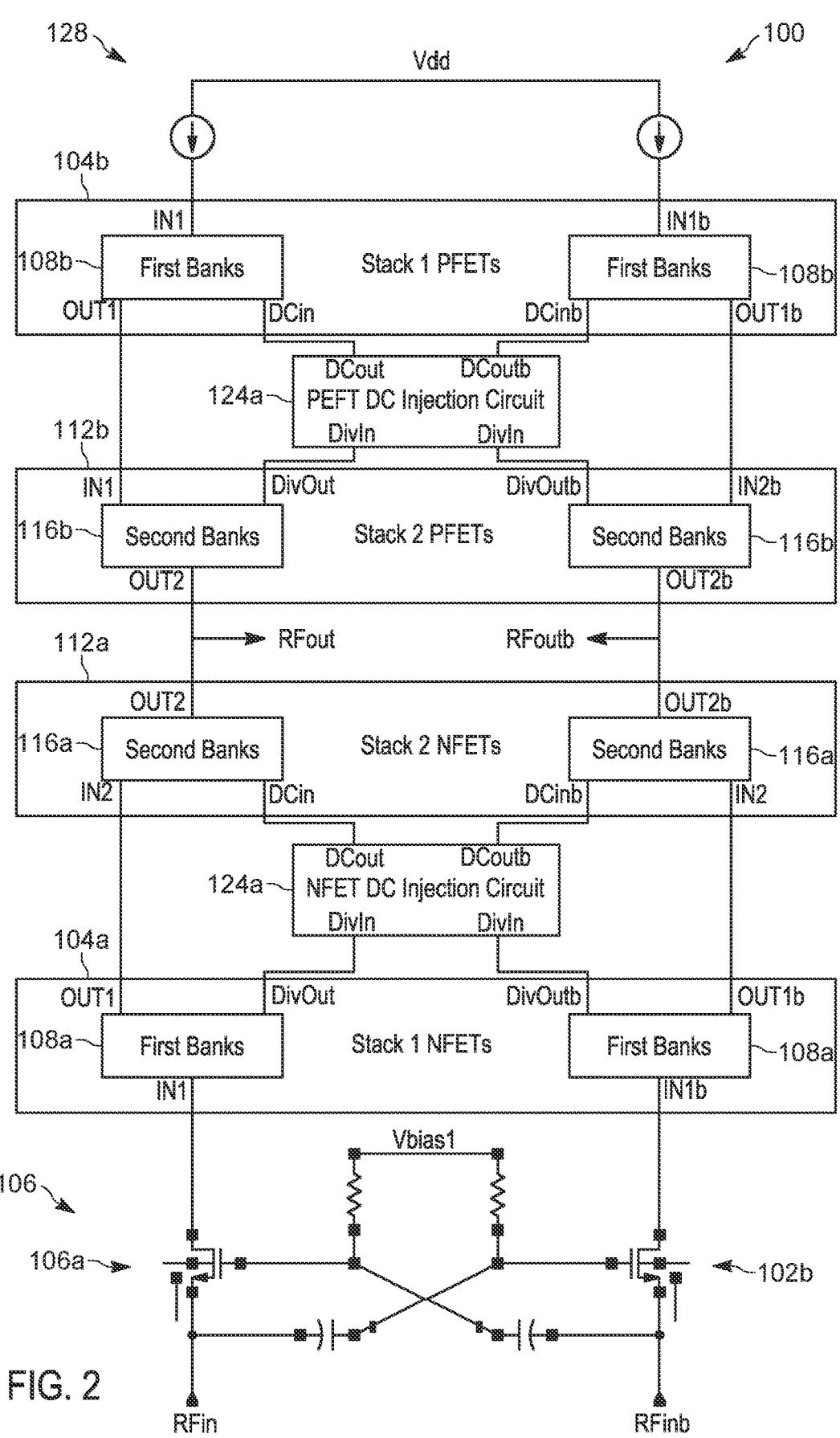
FIG. 2 illustrates an automatic gain control attenuator, according to some aspects.

In order to improve linearity, the first transistor stack 104 and the second transistor stack 112 may be arranged in a push-pull configuration having a plurality of n-channel field effect transistors (NFETs) configured to pull current, and a plurality of p-channel field effect transistors (PFETs) configured to push current. For example, FIG. 2 illustrates the AGC attenuator 100 including a first NFET stack 104*a*, a first PFET stack 104*b*, a second NFET stack 112*a*, and a second PFET stack 112*b*. The first NFET stack 104*a* includes a plurality of first NFET banks 108*a* of current steering differential NFET pairs. The first PFET stack 104*b* includes a plurality of first PFET banks 108*b* of current steering differential PFET pairs. Operation of the first NFET stack 104*a* and the first PFET stack 104*b* is substantially similar to that of the first transistor stack 104 as described above with reference to FIG. 1. For example, the first NFET stack 104*a* and the first PFET stack 104*b* are each configured to receive (at node IN1) the RF input signal, and receive (at node IN1*b*) the complementary RF input signal. The first NFET stack 104*a* and the first PFET stack 104*b* are each configured to output (at node OUT1) a first attenuated RF signal to the second NFET stack 112*a* and the second PFET stack 112*b*, respectively. The first NFET stack 104*a* and the first PFET stack 104*b* are also each configured to output (at node OUT1*b*) a first attenuated complementary RF signal to the second NFET stack 112*a* and the second PFET stack 112*b*, respectively.

The second NFET stack 112*a* includes a plurality of second NFET banks 116*a* of current steering differential NFET pairs. The second PFET stack 112*b* includes a plurality of second PFET banks 116*b* of current steering differential PFET pairs. Operation of the second NFET stack 112*a* and the second PFET stack 112*b* is substantially similar to that of the second transistor stack 112 as described above with reference to FIG. 1. For example, the second NFET stack 112*a* and the second PFET stack 112*b* are each configured to receive (at node IN2) a first attenuated RF signal from the first NFET stack 104*a* and the first PFET stack 104*b*, respectively. Similarly, the second NFET stack 112*a* and the second PFET stack 112*b* are each configured to receive (at node IN2*b*) a first attenuated complementary RF signal from the first NFET stack 104*a* and the first PFET stack 104*b*, respectively.

The second NFET stack 112a and the second PFET stack 112b are each configured to output (at node OUT2) a second attenuated RF signal to the output RFout of the AGC attenuator 100. The second NFET stack 112a and the second PFET stack 112b are also configured to output (at node OUT2b) a second attenuated complementary RF signal to the output RFoutb of the AGC attenuator 100.

As illustrated in FIG. 2, the AGC attenuator 100 also includes an NFET DC injection circuit 124a for injecting direct current to the second NFET stack 112a, and a PFET DC injection circuit 124b for injecting direct current to the second PFET stack 112b. Operation of the NFET DC injection circuit 124a and the PFET DC injection circuit 124b is substantially similar to operation of the DC injection circuit 124 described above with reference to FIG. 1.

Figures 3A, 3B:
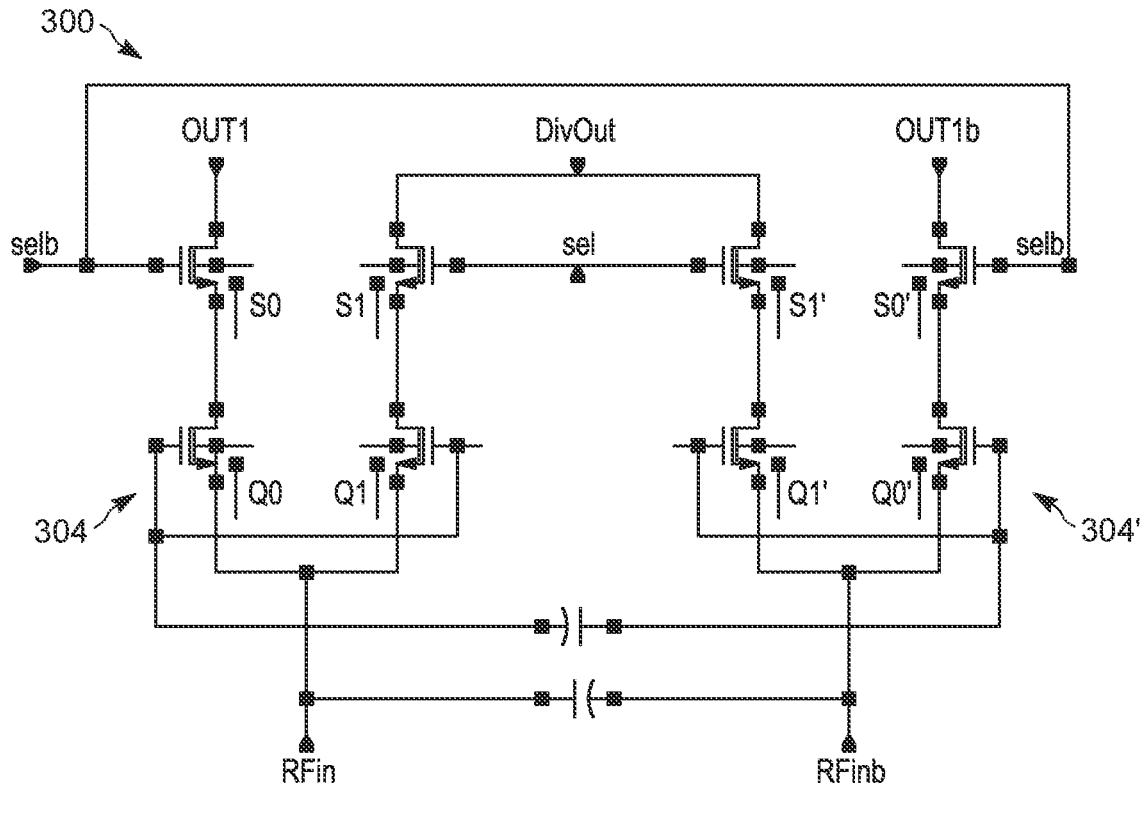
FIG. 3A illustrates a first stack of an automatic gain control attenuator, according to some aspects.
FIG. 3B illustrates a first stack of an automatic gain control attenuator, according to some aspects.
Figure 3C:
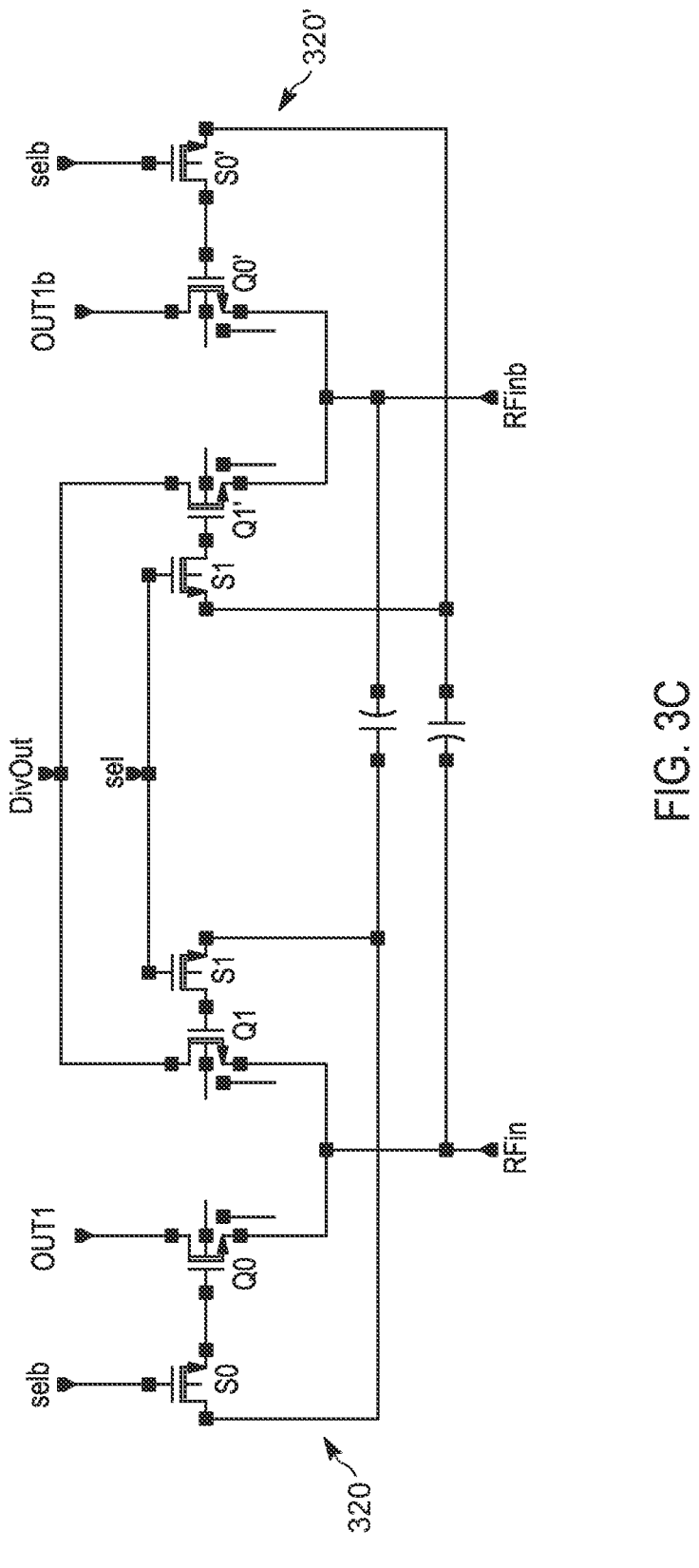
FIG. 3C illustrates a first stack of an automatic gain control attenuator, according to some aspects.

Sufficient voltage headroom between the drain and source of each transistor in the AGC attenuator 100 is required in order to maintain each transistor in the first transistor stack 104 and the second transistor stack 112 in the active region. For example, sufficient voltage headroom is required for RF input transistors 106, the first transistor stack 104, the second transistor stack 112, and the current source 128. In order to reduce overall voltage headroom requirements for the AGC attenuator 100, the RF input transistors 106 may be absorbed into the first transistor stack 104 such that the first transistor stack 104 is no longer cascoded with RF input transistors 106. FIGS. 3A-3C illustrate respective first, second, and third alternate examples of the first transistor stack 104. As described above with reference to FIG. 1, the plurality of first banks 108 of the first transistor stack 104 include current steering differential transistor pairs for steering the RF signals RFin and RFinb. In the examples illustrated in FIGS. 3A-3C, the RF input transistors 106a and 106b are respectively split into differential transistor pairs including a main RF transistor and a complementary RF transistor disposed in the first transistor stack 104. As will be described in greater detail below, each respective RF transistor in a differential transistor pair is turned on or off complementary to one another by a switch electrically connected in series to one of the source terminal, the drain terminal, or the gate terminal of the RF transistor. By turning the main RF transistor and the complementary RF transistor on or off complementary to one another using respective switches, the first transistor stack is operable to steer the RF signal.

Referring now to FIG. 3A, a first alternate example of a first transistor stack 300 is illustrated. While FIG. 3A is described below with reference to differential transistor pairs 304 and 304', it should be understand that differential transistor pairs 304 and 304' respectively represent banks of differential transistor pairs. Differential transistor pair 304 includes a main RF transistor Q0 and a complementary RF transistor Q1. The source terminal of main RF transistor Q0 and the source terminal of complementary RF transistor Q1 are each electrically connected to the RF input signal RFin of the AGC attenuator 100. The gate terminal of the main RF transistor Q0 and the gate terminal of the complementary RF transistor Q1 are each electrically connected to the complementary RF input signal RFinb of the AGC attenuator 100. The drain terminal of the main RF transistor Q0 is electrically connected in series to the source terminal of a main steering switch S0. The drain terminal of the complementary RF transistor Q1 is electrically connected in series to the source terminal of a complementary steering switch S1. The gate terminal of the main steering switch S0 and the gate terminal of the complementary steering switch are configured to receive complementary selection signals selb and sel, respectively. In this manner, the main steering switch S0 and the complementary steering switch S1 are switched complementary to each other in order to output an attenuated RF signal and a diverted current. The drain terminal of the main steering switch S0 is connected to the OUT1 node of the first transistor stack 300 for outputting a first attenuated RF signal. The drain terminal of the complementary steering switch S1 is connected to the DivOut node of the first transistor stack 300 for outputting the diverted current.

Differential transistor pair 304' includes a main RF transistor Q0', a complementary RF transistor Q1', a main steering switch S0', and a complementary steering switch S1'. Operation of the differential transistor pair 304' is substantially similar to operation of the differential transistor pair 304, however, as illustrated in FIG. 3B, the differential transistor pair 304' is configured to receive and attenuate the complementary RF input signal RFinb of the AGC attenuator 100.

Referring now to FIG. 3B, a second alternate example of a first transistor stack 308 is illustrated. Differential transistor pair 312 includes a main RF transistor Q0 and a complementary RF transistor Q1. Similar to the first alternate example of the first transistor stack 300 described above with reference to FIG. 3A, the second alternate example of the first transistor stack 308 includes a main RF transistor Q0 and a complementary RF transistor Q1, and is configured to attenuate RF input signals by alternately switching a main steering switch S0 and a complementary steering switch S1. In contrast to the first transistor stack 300 described above with reference to FIG. 3A, the main steering switch S0 and the complementary steering switch S1 are electrically connected in series to respective source terminals of the main RF transistor Q0 and the complementary RF transistor Q1 in order to control steering of the RF input signal.

Referring now to FIG. 3C, a third alternate example of a first transistor stack 316 is illustrated. Differential transistor pair 320 includes a main RF transistor Q0 and a complementary RF transistor Q1. Similar to the first alternate example and second alternate example transistor stacks described above with reference to FIGS. 3A and 3B, respectively, the third alternate example of the first transistor stack 316 includes a main RF transistor Q0 and a complementary RF transistor Q1, and is configured to attenuate RF input signals by alternately switching a main steering switch S0 and a complementary steering switch S1. In contrast to the first and second alternate example transistor stacks described above with reference to FIGS. 3A and 3B, the main steering switch S0 and the complementary steering switch S1 are electrically connected in series to respective gate terminals of the main RF transistor Q0 and the complementary RF transistor Q1 in order to control steering of the RF input signal.

It should be understood that the any one of the first, second, or third alternate example of the first transistor stack may be applied to one or both the first NFET stack 104a and the first PFET stack 104b described above with reference to FIG. 2. Alternatively, one or both of the first NFET stack 104a and the first PFET stack 104b may be implemented as described above with reference FIG. 1.

Figure 4:
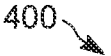
FIG. 4 illustrates a method for attenuating a radio frequency signal, according to some aspects.
Figure 4:
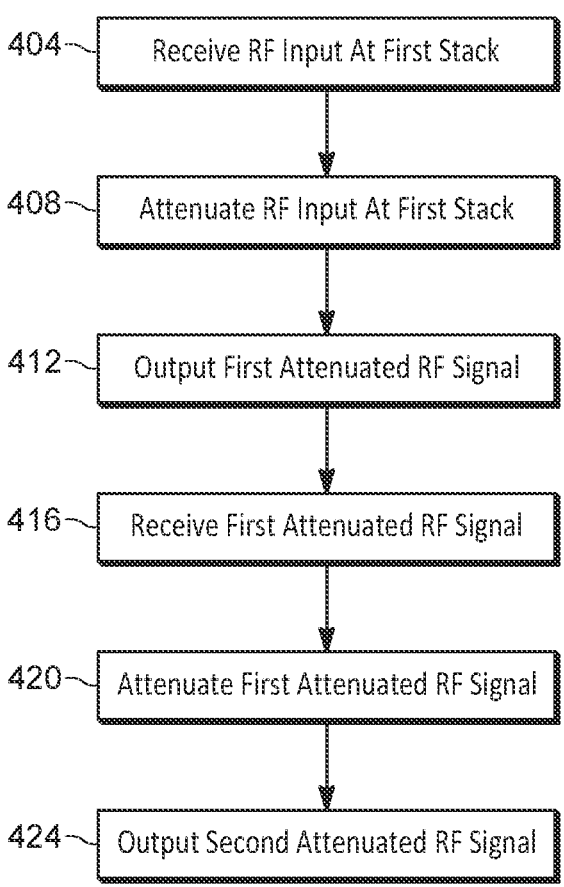

FIG. 4 illustrates an example method 400 for attenuating an RF signal, according to some examples. For simplicity, the method 400 is described as being performed by the AGC attenuator 100 using elements of the AGC attenuator 100 described in reference to FIG. 1 (e.g., the first transistor stack 104, the second transistor stack 112, etc.). However, it should be understood that the method 400 may be performed using any of the elements of the AGC attenuator 100 described with reference to FIGS. 2 and 3A-3B. Additionally, the method 400 may be modified or performed differently than the specific example provided.

At block 404, the first transistor stack 104 receives a RF input signal via RF input transistors 106. At block 408, the first transistor stack 104 attenuates, with each of the plurality of first banks 108, the RF input signal by a predetermined value. At block 412, the first transistor stack 104 outputs a first attenuated RF signal to the second transistor stack 112. At block 416, the second transistor stack 112 receives the first attenuated RF signal from the first transistor stack 104. At block 420, the second transistor stack 112 attenuates, with the plurality of second banks 116, the first attenuated RF signal by a predetermined value. At block 424, the second transistor stack 112 outputs a second attenuated RF signal to the output of the AGC attenuator 100.

Figure 5:
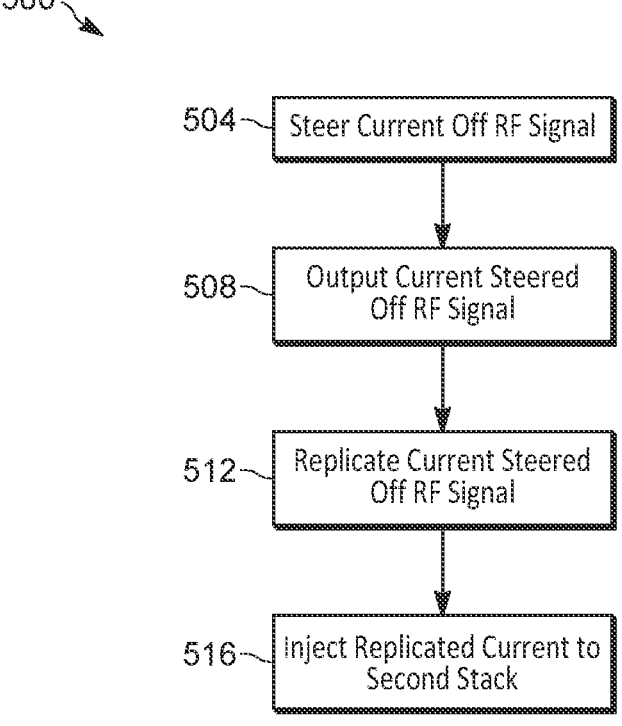
FIG. 5 illustrates a method for injecting direct current into a second stack of an automatic gain control attenuator, according to some aspects.

FIG. 5 illustrates an example method 500 for injecting a direct current in a second transistor stack. For simplicity, the method 500 is described as being performed by the AGC attenuator 100 using elements of the AGC attenuator 100 described in reference to FIG. 1 (e.g., the first transistor stack 104, the second transistor stack 112, etc.). However, it should be understood that the method 500 may be performed using any of the elements of the AGC attenuator 100 described with reference to FIGS. 2 and 3A-3B. Additionally, the method 500 may be modified or performed differently than the specific example provided.

At block 504, the first transistor stack 104 steers current away from an RF input signal. At block 508, the first transistor stack 104 outputs, as a diverted current, the current steered away from the RF input signal to the DC injection circuit 124. At block 512, the DC injection circuit 124 replicates the diverted current. At block 516, the DC injection circuit 124 injects the replicated diverted current into the second transistor stack 112.

In the foregoing specification, specific examples have been described. However, one of ordinary skill in the art appreciates that various modifications and changes can be made without departing from the scope of the claimed subject matter. For example, although the AGC attenuator 100 is illustrated in FIGS. 1-3 and described above as being implemented in a fully differential LNA having output nodes RFout and RFoutb, it should be understood that the AGC attenuator 100 may also be implemented in a single-ended LNA having output node RFout referenced to, for example, ground. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way but may also be configured in ways that are not listed.

It will be appreciated that some examples may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an example can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. An automatic gain control (AGC) attenuator for an amplifier, the AGC attenuator comprising:

a first transistor stack including a plurality of first banks of current steering differential transistor pairs and configured to receive a radio frequency (RF) input signal and output a first attenuated RF signal, wherein each first bank of the plurality of first banks is configured to attenuate the RF input signal by a predetermined value; and a second transistor stack including a plurality of second banks of current steering differential transistor pairs, that is cascoded to the first transistor stack, and that is configured to receive the first attenuated RF signal and to output a second attenuated RF signal, wherein each second bank of the plurality of second banks is configured to attenuate the first attenuated RF signal by a predetermined value.

2. The AGC attenuator of claim 1, wherein each differential transistor pair in the first transistor stack includes a main transistor and a complementary transistor, wherein the main transistor is configured to receive a first source signal and a first gate signal, and the complementary transistor is configured to receive the first source signal and a second gate signal, the second gate signal being complementary to the first gate signal.

3. The AGC attenuator of claim 1, wherein each differential transistor pair in the first transistor stack includes a main transistor including a first drain terminal, a first source terminal, and a first gate terminal, a complementary transistor including a second drain terminal, a second source terminal, and a second gate terminal, a first switch electrically connected in series with at least one selected from the group consisting of the first drain terminal, the first source terminal, and the first gate terminal, and a second switch electrically connected in series with at least one selected from the group consisting of the second drain terminal, the second source terminal, and the second gate terminal.

4. The AGC attenuator of claim 1, further comprising a DC injection circuit configured to provide a DC injection current to the second transistor stack, wherein the DC injection current is approximately equal to an amount of current steered away from the RF input signal.

5. The AGC attenuator of claim 4, wherein the DC injection circuit includes a current mirror circuit and is configured to sense a current steered away from the RF input signal, generate a mirror of the current steered away from the RF input signal, and output the mirror as the DC injection current.

6. The AGC attenuator of claim 5, wherein the DC injection circuit is configured to estimate an amount of current steered away from the RF input signal, and output an estimated current as the DC injection current.

7. The AGC attenuator of claim 4, wherein the DC injection circuit includes a replica of the first transistor stack and is configured to sense a current steered away from an RF input signal in the replica of the first transistor stack, and output the current steered away from the RF input signal in the replica of the first transistor stack as the DC injection current.

8. The AGC attenuator of claim 4, wherein the DC injection circuit is configured to receive a current steered away from the RF input signal, filter RF content from the current steered away from the RF input signal, and output a filtered current as the DC injection current.

9. The AGC attenuator of claim 1, wherein the first transistor stack is arranged in a push-pull configuration and includes a plurality of n-channel field effect transistors (NFETs) and a plurality of p-channel field effect transistors (PFETs).

10. The AGC attenuator of claim 1, wherein a number of transistors included in each first bank of the plurality of first banks is determined by a logarithmic function, and a number of transistors included in each second bank of the plurality of second banks is determined by a logarithmic function.

11. The AGC attenuator of claim 1, wherein a number of transistors included in each first bank of the plurality of first banks is determined by a linear function, a number of transistors included in each second bank of the plurality of second banks is determined by a linear function; and the AGC attenuator further comprises a control circuit configured to control switching of each first bank of the plurality of first banks logarithmically, and control switching of each second bank of the plurality of second banks logarithmically.

12. A method of attenuating an RF signal for an amplifier, the method comprising:

receiving, with a first transistor stack including a plurality of first banks of current steering differential transistor pairs, a radio frequency (RF) input signal;

attenuating, with each first bank of the plurality of first banks, the RF input signal by a predetermined value;

outputting, with the first transistor stack, a first attenuated RF signal;

receiving, with a second transistor stack that includes a plurality of second banks of current steering differential transistor pairs and is cascoded to the first transistor stack, the first attenuated RF signal;

attenuating, with each second bank of the plurality of second banks, the first attenuated RF signal by a predetermined value; and outputting, with the second transistor stack, a second attenuated RF signal.

13. The method of claim 12, further comprising providing, with a DC injection circuit, a DC injection current to the second transistor stack, wherein the DC injection current is approximately equal to an amount of current steered away from the RF input signal.

14. The method of claim 13, wherein the DC injection circuit includes a current mirror circuit, and the method further comprises sensing, with the DC injection circuit, a current steered away from the RF input signal, generating, with the current mirror circuit, a mirror of the current steered away from the RF input signal, and outputting, with the DC injection circuit, the mirror as the DC injection current.

15

15. The method of claim 13, further comprising:

estimating, with the DC injection circuit, an amount of current steered away from the RF input signal; and outputting, with the DC injection circuit, an estimated current as the DC injection current.

16. The method of claim 13, wherein the DC injection circuit includes a replica of the first transistor stack, and the method further comprises sensing, with the DC injection circuit, a current steered away from an RF input signal of the replica of the first transistor stack; and outputting, with the DC injection circuit, the current steered away from the RF input signal of the replica of the first transistor stack as the DC injection current.

17. The method of claim 13, further comprising:

receiving, with the DC injection circuit, a current steered away from the RF input signal;

filtering, with the DC injection circuit, RF content from the current steered away from the RF input signal; and outputting; with the DC injection circuit, a filtered current as the DC injection current.

18. The method of claim 12, wherein the first transistor stack is arranged in a push-pull configuration and includes a plurality of n-channel field effect transistors (NFETs) and a plurality of p-channel field effect transistors (PFETs).

19. The method of claim 12, wherein a number of transistors included in each first bank of the plurality of first banks is determined by a logarithmic function, and a number of transistors included in each second bank of the plurality of second banks is determined by a logarithmic function.

20. The method of claim 12, wherein a number of transistors in each first bank of the plurality of first banks is determined by a linear function, a number of transistors in each second bank of the plurality of second banks is determined by a linear function; and the method further comprises controlling, with a control circuit, switching of each first bank of the plurality of first banks logarithmically, and controlling, with a control circuit, switching of each second bank of the plurality of second banks logarithmically.

* * * * *